(12) United States Patent  
Okura

(10) Patent No.: US 9,272,856 B2  
(45) Date of Patent: Mar. 1, 2016

(54) IMAGE FORMING APPARATUS

(71) Applicant: KYOCERA Document Solutions Inc., Osaka-shi, Osaka (JP)

(72) Inventor: Yoshimasa Okura, Osaka (JP)

(73) Assignee: KYOCERA Document Solutions Inc. (JP)

( * ) Notice: Subject to any disclaimer, the term of this patent is extended or adjusted under 35 U.S.C. 154(b) by 0 days.

(21) Appl. No.: 14/536,736

(22) Filed: Nov. 10, 2014

(65) Prior Publication Data
US 2015/0130125 A1 May 14, 2015

(30) Foreign Application Priority Data

Nov. 13, 2013 (JP) ................. 2013-234998

(51) Int. Cl.
B65H 1/04 (2006.01)
B65H 1/26 (2006.01)
H05K 5/02 (2006.01)
G03G 15/00 (2006.01)

(52) U.S. Cl.
CPC ................. *B65H 1/04* (2013.01); *B65H 1/266* (2013.01); *G03G 15/6514* (2013.01); *H05K 5/0217* (2013.01); *B65H 2402/31* (2013.01); *G03G 2215/00392* (2013.01)

(58) Field of Classification Search
CPC .. B65H 1/04; B65H 2402/31; B65H 2402/32; B65H 2402/35; B65H 2402/441; B65H 2402/442; B65H 2402/45; B65H 2402/521; G03G 15/6514; G03G 2215/00392; H05K 5/0221

See application file for complete search history.

(56) References Cited

U.S. PATENT DOCUMENTS

| 6,215,970 | B1 | 4/2001 | Yoshikawa et al. | |
| 7,653,328 | B2 * | 1/2010 | Igarashi et al. | 399/124 |
| 7,704,001 | B2 * | 4/2010 | Igarashi | 400/691 |
| 8,331,826 | B2 * | 12/2012 | Minaminaka | 399/110 |
| 8,653,362 | B2 * | 2/2014 | Tsujishita | 174/50 |
| 2004/0114980 | A1 | 6/2004 | Nanno | |
| 2012/0211937 | A1 | 8/2012 | Motoki | |

FOREIGN PATENT DOCUMENTS

JP 2000-044090 2/2000
JP 2010102124 5/2010

* cited by examiner

Primary Examiner — Michael McCullough
(74) Attorney, Agent, or Firm — Gerald E. Hespos; Michael J. Porco; Matthew T. Hespos

(57) ABSTRACT

An image forming apparatus includes an apparatus main body, an image forming unit, a tray unit and an attaching portion. The tray unit includes a pivot portion. The sheet is placed on the tray unit in an open state. The tray unit is capable of making a sliding movement in an axial direction of the pivot portion in a closed state. The tray unit is attached to the attaching portion in the closed state. The tray unit includes a pair of hooks that project from opposite end parts in the axial direction and each includes a projection. The attaching portion includes a pair of openings and a pair of engaging portions. The projections are inserted into the opening. Engaged positions of the projections with the engaging portions are variable according to the sliding movement in the closed state of the tray unit.

6 Claims, 14 Drawing Sheets

FIG. 4
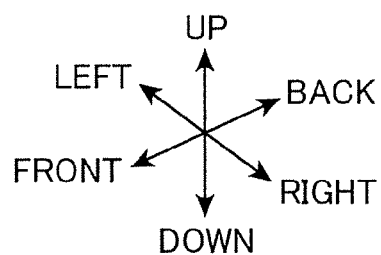
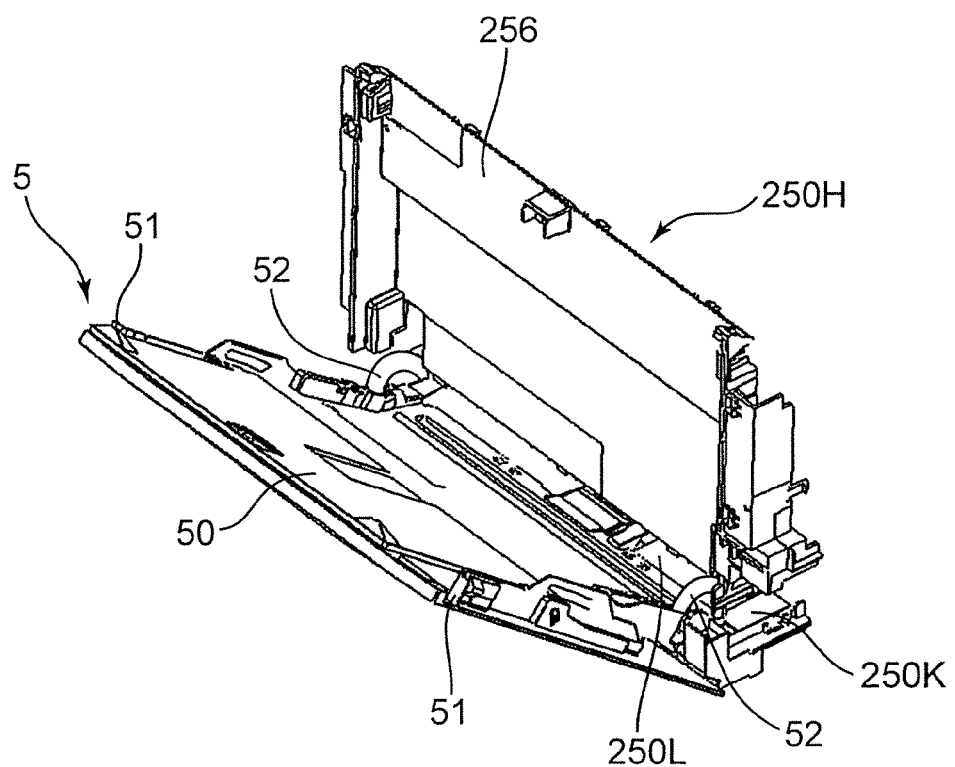

FIG. 10A
FIG. 10B
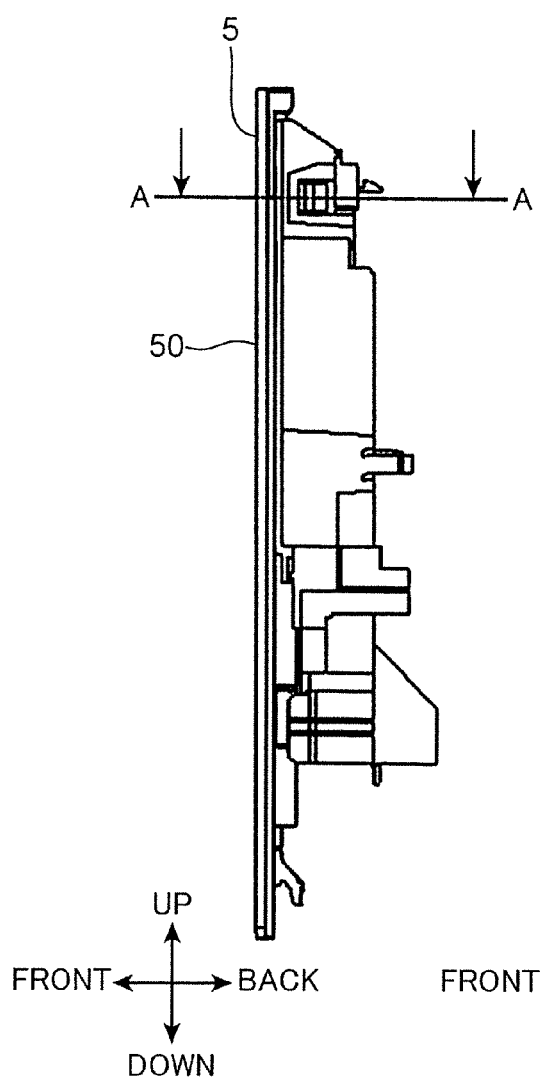
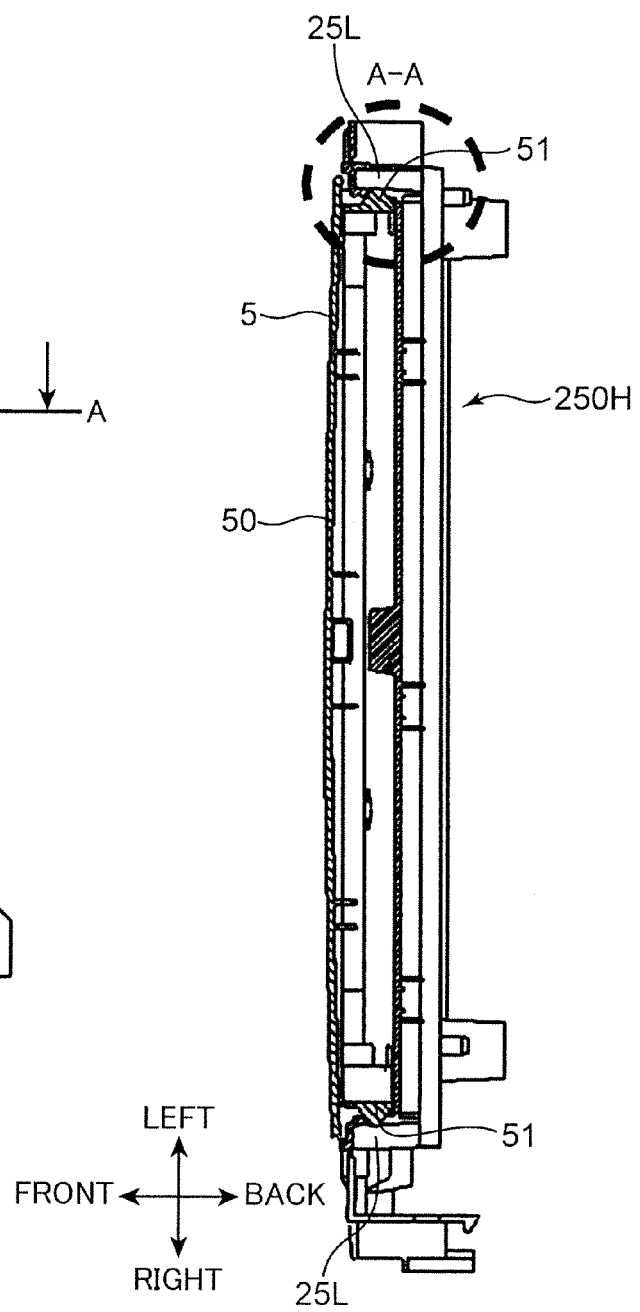

IMAGE FORMING APPARATUS

INCORPORATION BY REFERENCE

This application is based on Japanese Patent Application No. 2013-234998 filed with the Japan Patent Office on Nov. 13, 2013, the contents of which are hereby incorporated by reference.

BACKGROUND

The present disclosure relates to an image forming apparatus for forming an image on a sheet.

Conventionally, an image forming apparatus for forming an image on a sheet includes a sheet feeding unit, an image forming unit and a sheet discharging portion. An image is formed on a surface of a sheet fed from the sheet feeding unit in the image forming unit. Thereafter, the sheet is discharged to the sheet discharging portion provided on an apparatus main body of the image forming apparatus. Further, some image forming apparatuses are known to include a manual feed tray. The manual feed tray is openable with respect to the apparatus main body and a sheet is placed thereon in an open state.

There is also known a technology with a manual feed tray withdrawable from an apparatus main body of an image forming apparatus and a lid member coupled to the manual feed tray and openable with respect to the apparatus main body.

In such a technology, the openable lid member includes a pair of hook members to be engaged with the apparatus main body and spaced apart in a sheet width direction.

SUMMARY

An image forming apparatus according to one aspect of the present disclosure includes an apparatus main body, an image forming unit, a tray unit and an attaching portion. The image forming unit is arranged in the apparatus main body and forms an image on a sheet. The tray unit includes a pivot portion on a lower end part. The tray unit is openable with respect to the apparatus main body by being rotated about the pivot portion. The sheet is placed on an upper surface of the tray unit in an open state with respect to the apparatus main body. The tray unit is capable of making a sliding movement in an axial direction of the pivot portion in a closed state with respect to the apparatus main body. The attaching portion is arranged on the apparatus main body and the tray unit is attached thereto in the closed state. The tray unit includes a pair of hooks. The hooks project from opposite end parts in the axial direction toward the apparatus main body and each includes a base end portion and a projection projecting toward an axially outer side on a tip part of the base end portion. The attaching portion includes a pair of openings and a pair of engaging portions. The projections are inserted into the openings toward the axially outer sides. The engaging portions define parts of the openings and the projections are engaged therewith. Engaged positions of the projections with the engaging portions in the axial direction are variable according to the sliding movement in the closed state of the tray unit.

BRIEF DESCRIPTION OF THE DRAWINGS

FIG. 4 is a perspective view showing a state where the manual feed tray according to the one embodiment of the present disclosure is opened, FIG. 10A is a side view showing a state where the manual feed tray according to the one embodiment of the present disclosure is properly fixed to the apparatus main body and FIG. 10B is a sectional view showing the state where the manual feed tray according to the one embodiment of the present disclosure is properly fixed to the apparatus main body.

DETAILED DESCRIPTION

Figure 1:
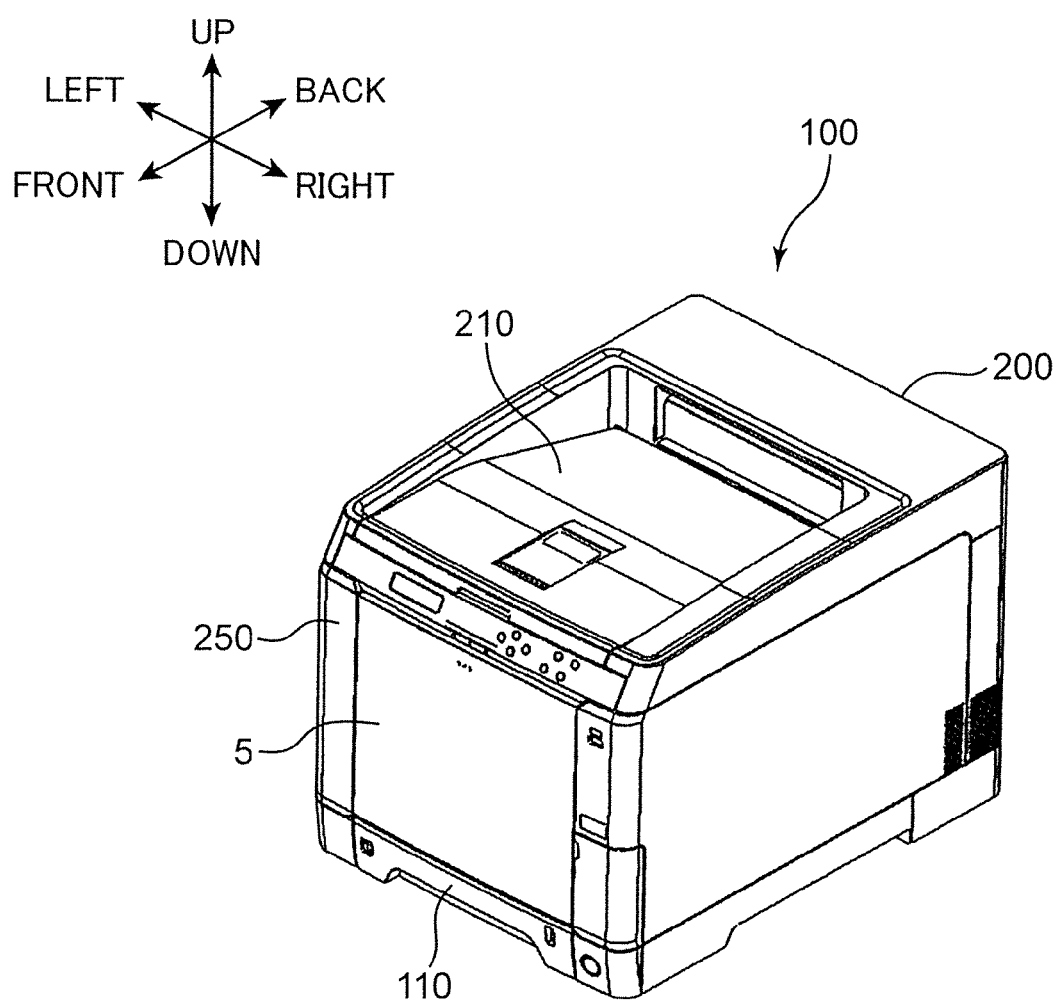
FIG. 1 is a perspective view showing the external appearance of an image forming apparatus according to one embodiment of the present disclosure.
Figure 2:
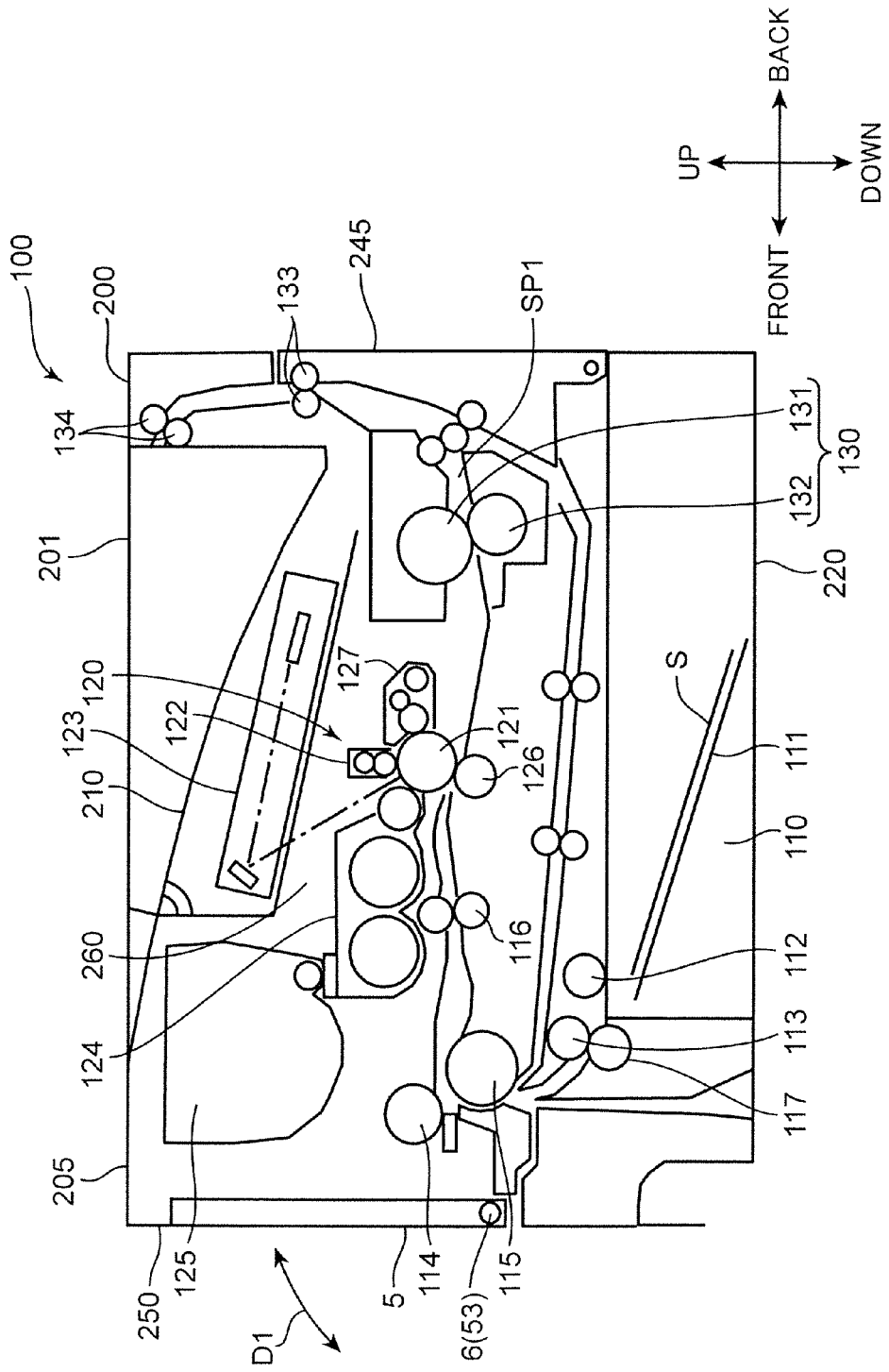
FIG. 2 is a sectional view schematically showing the internal structure of the image forming apparatus according to the one embodiment of the present disclosure.

Hereinafter, one embodiment of the present disclosure is described with reference to the drawings. FIG. 1 is a perspective view of a printer 100 (image forming apparatus) according to one embodiment of the present disclosure. FIG. 2 is a sectional view schematically showing the internal structure of the printer 100. Although the printer 100 shown in FIGS. 1 and 2 is a so-called monochrome printer, the image forming apparatus may be a color printer, a facsimile machine, a complex machine provided with these functions or another apparatus for forming a toner image on a sheet in another embodiment. Note that direction-indicating terms such as "upper" and "lower", "front" and "rear", "left" and "right" used in the following description are merely for the purpose of clarifying the description and do not limit the principle of the image forming apparatus at all.

The printer 100 is provided with a housing 200 (apparatus main body) for housing various devices for forming an image on a sheet S. The housing 200 includes an upper wall 201 defining the upper surface of the housing 200, a bottom wall 220 (FIG. 2) defining the bottom surface of the housing 200, a back wall 245 (FIG. 2) between the upper wall 201 and the bottom wall 220 and a front wall 250 located in front of the back wall 245. The housing 200 has a main body internal space 260 (internal space) in which various devices are arranged.

A sheet discharging portion 210 is arranged in a central part of the upper wall 201. The sheet discharging portion 210 is formed by an inclined surface inclined downwardly from a front part to a rear part of the upper wall 201. A sheet S having an image formed thereon in an image forming unit 120 to be described later is discharged to the sheet discharging portion 210.

Further, a manual feed tray 5 is arranged in a central part of the front wall 250. The manual feed tray 5 is vertically rotatable (arrow D1 of FIG. 2) about a supporting shaft portion 6 (pivot portion) arranged on a lower end part, thereby being openable with respect to the housing 200. Note that the manual feed tray 5 according to this embodiment is described in detail later.

The printer 100 includes a sheet conveyance path SP1, a cassette 110, a pickup roller 112, a first feed roller 113, a retard roller 117, a second feed roller 114, a conveyor roller 115, a pair of registration rollers 116 and the image forming unit 120. The sheet conveyance path SP1 is a conveyance path which is arranged in the housing 200 and in which a sheet S is conveyed in a predetermined direction.

Sheets S are stored in the cassette 110. The cassette 110 includes a lift plate 111 for supporting the sheets S. The lift plate 111 is inclined to push up the leading edges of the sheet S. The cassette 110 defines a part of the front wall 250 of the housing 200 and withdrawable forward with respect to the housing 200.

The pickup roller 112 is arranged above the leading edges of the sheets S pushed up by the lift plate 111. When the pickup roller 112 rotates, the sheet S is pulled out of the cassette 110 and conveyed into the sheet conveyance path SP1.

The first feed roller 113 is arranged downstream of the pickup roller 112. The first feed roller 113 feeds the sheet S to a further downstream side. The retard roller 117 deters a plurality of sheets S from being simultaneously fed by the first feed roller 113. The second feed roller 114 is arranged at an inner side (rear side) of a pivot of the manual feed tray 5. The second feed roller 114 pulls a sheet S on the manual feed tray 5 into the housing 200. A user can selectively use the sheet S stored in the cassette 110 or the sheet S placed on the manual feed tray 5.

The conveyor roller 115 is arranged downstream of the first feed roller 113 in a sheet conveying direction (hereinafter, also merely referred to as the "conveying direction"). Hereinafter, a downstream side may be mentioned without reference to the sheet conveying direction. The conveyor roller 115 is arranged to face the second feed roller 114 and conveys the sheet S fed by the first feed roller 113 to a further downstream side.

The pair of registration rollers 116 have a function of correcting the oblique feed of the sheet S. The position of an image formed on the sheet is adjusted by this. The pair of registration rollers 116 supply the sheet S to the image forming unit 120 in accordance with an image forming timing by the image forming unit 120.

The image forming unit 120 is arranged in the housing 200 and forms a toner image on a sheet S. The image forming unit 120 includes a photoconductive drum 121, a charger 122, an exposure device 123, a developing device 124, a toner container 125, a transfer roller 126 and a cleaning device 127.

The photoconductive drum 121 has a cylindrical shape. The photoconductive drum 121 has an electrostatic latent image formed on a circumferential surface thereof and carries a toner image corresponding to the electrostatic latent image. A predetermined voltage is applied to the charger 122, which substantially uniformly charges the circumferential surface of the photoconductive drum 121.

The exposure device 123 irradiates laser light to the circumferential surface of the photoconductive drum 121 charged by the charger 122. The laser light is irradiated in accordance with image data output from an external apparatus (not shown) such as a personal computer communicably connected to the printer 100. As a result, an electrostatic latent image corresponding to the image data is formed on the circumferential surface of the photoconductive drum 121.

The developing device 124 supplies toner to the circumferential surface of the photoconductive drum 121 on which an electrostatic latent image is formed. The toner container 125 supplies the toner to the developing device 124. When the developing device 124 supplies the toner to the photoconductive drum 121, the electrostatic latent image formed on the circumferential surface of the photoconductive drum 121 is developed (visualized). As a result, a toner image is formed on the circumferential surface of the photoconductive drum 121.

The transfer roller 126 is rotatably arranged to come into contact with the circumferential surface of the photoconductive drum 121. When a sheet S conveyed from the pair of registration rollers 116 passes between the photoconductive drum 121 and the transfer roller 126, a toner image formed on the circumferential surface of the photoconductive drum 121 is transferred to the sheet S. Note that the transfer roller 126 is arranged at a side of the photoconductive drum 121 opposite to the exposure device 123.

The cleaning device 127 removes the toner remaining on the circumferential surface of the photoconductive drum 121 after a toner image is transferred to a sheet S. The circumferential surface of the photoconductive drum 121 cleaned by the cleaning device 127 passes below the charger 122 again to be uniformly charged. Thereafter, the aforementioned toner image formation is performed anew.

The printer 100 further includes a fixing device 130 for applying a toner image fixing process to a sheet S at a side downstream of the image forming unit 120 in the conveying direction. The fixing device 130 includes a heating roller 131 for melting the toner on the sheet S and a pressure roller 132 for bringing the sheet S into close contact with the heating roller 131. When the sheet S passes between the heating roller 131 and the pressure roller 132, the toner image is fixed to the sheet S. The heating roller 131 is driven to rotate by an unillustrated drive mechanism. The pressure roller 132 is rotated, following the rotation of the heating roller 131.

The printer 100 further includes a pair of conveyor rollers 133 arranged downstream of the fixing device 130 and a pair of discharge rollers 134 arranged downstream of the pair of conveyor rollers 133. The sheet S is conveyed upwardly by the pair of conveyor rollers 133 and finally discharged from the housing 200 by the pair of discharge rollers 134. Sheets S discharged from the housing 200 are stacked on the sheet discharging portion 210.

Figure 3:
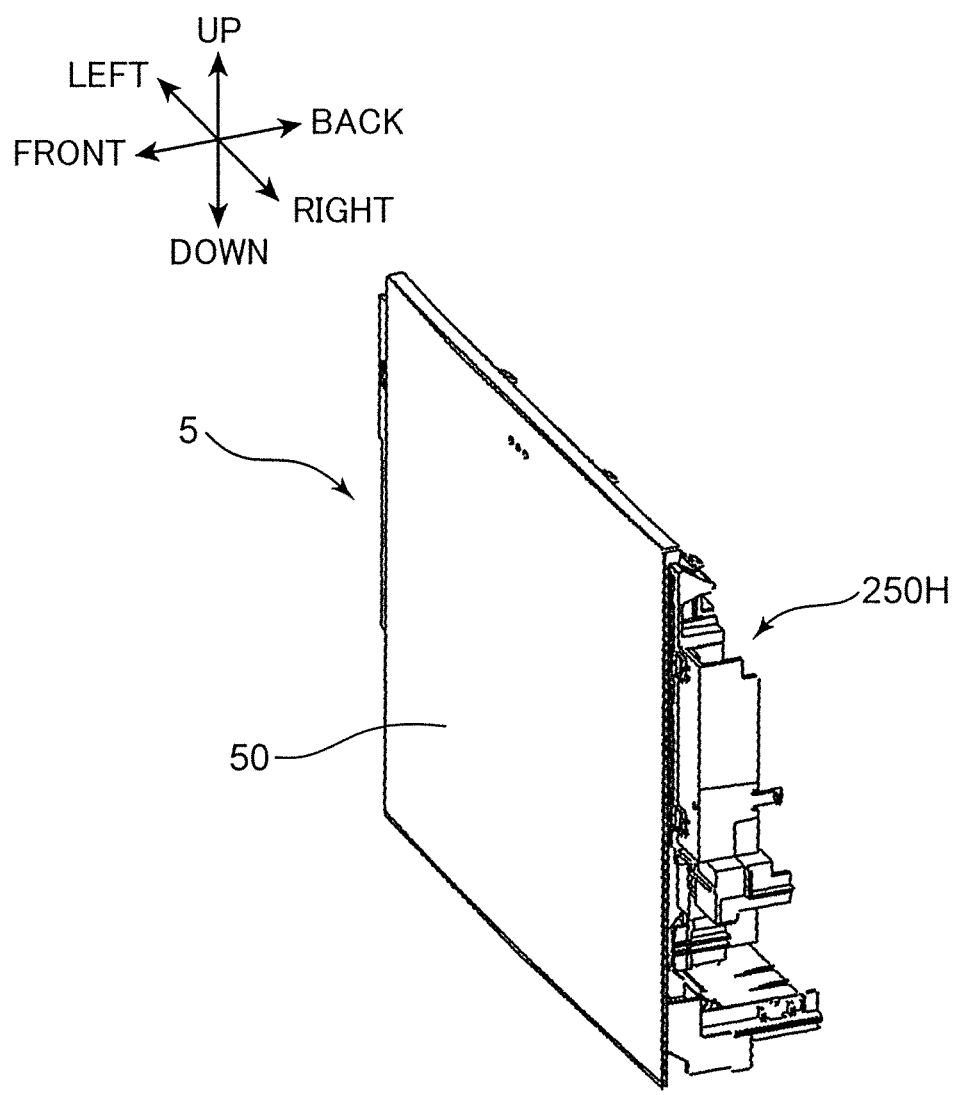
FIG. 3 is a perspective view of a manual feed tray according to the one embodiment of the present disclosure.

Next, the structure of the manual feed tray 5 (tray unit) according to this embodiment is described in detail with reference to FIGS. 3 to 5 in addition to FIGS. 1 and 2. FIG. 3 is a perspective view of the manual feed tray 5 according to this embodiment. Note that a closed state of the manual feed tray 5 with respect to the housing 200 is shown in FIG. 3 and a front frame 250H as a part of the housing 200 is also shown. Further, FIGS. 4 and 5 are perspective views showing a state where the manual feed tray 5 according to this embodiment is open.

In an open state of the manual feed tray 5 with respect to the housing 200, a sheet S is placed on the upper surface of the manual feed tray 5. Further, the manual feed tray 5 is slidable in a sheet width direction (axial direction of the supporting shaft portion 6 to be described later, lateral direction) in the closed state with respect to the housing 200.

Figure 5:
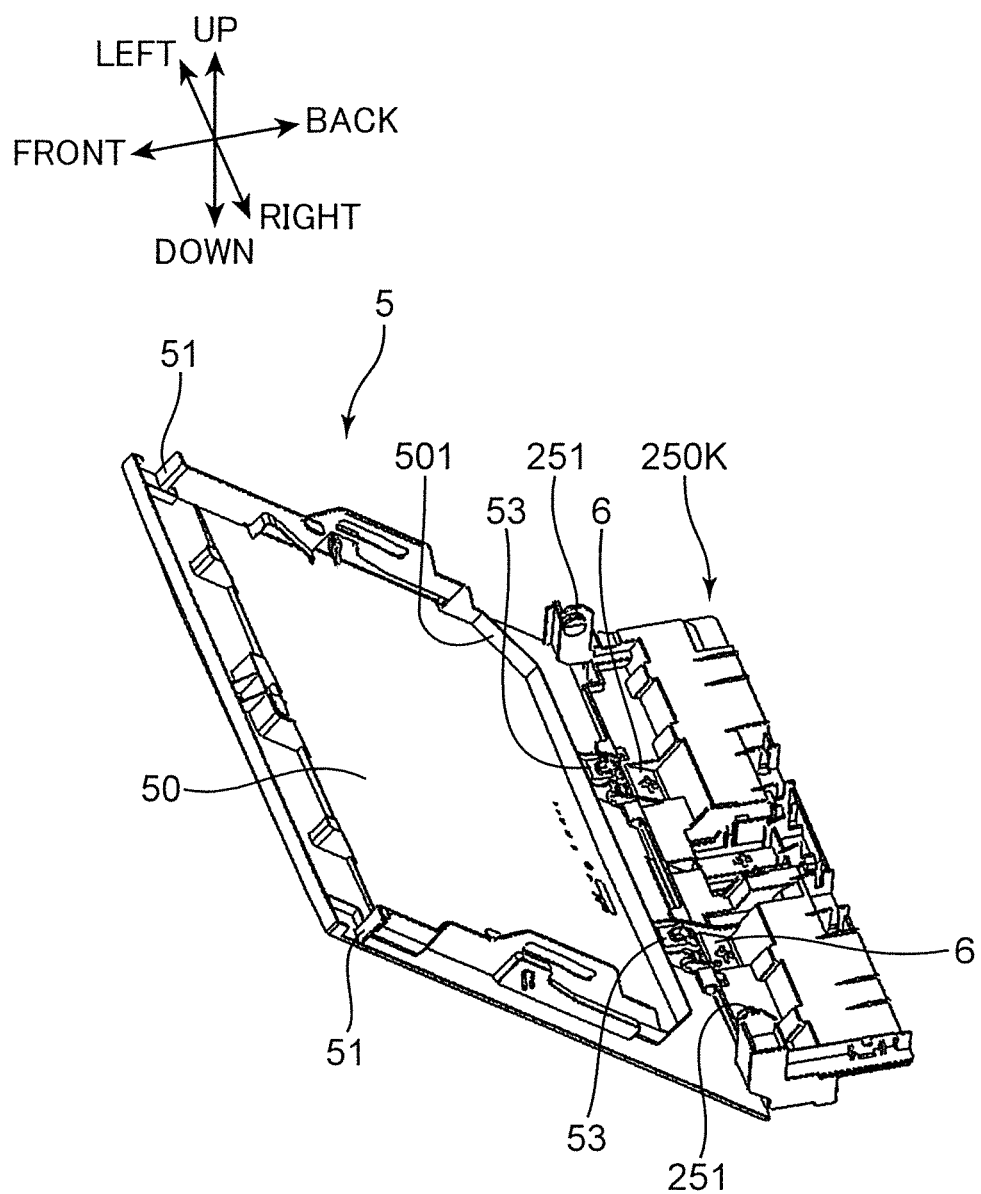
FIG. 5 is a perspective view showing a state where the manual feed tray according to the one embodiment of the present disclosure is opened.

With reference to FIGS. 4 and 5, the manual feed tray 5 includes a tray main body 50, hooks 51 (hook), link members 52 and bearing portions 53 (pivot portion).

The tray main body 50 is a main body part of the manual feed tray 5. In the aforementioned open state of the manual feed tray 5, a sheet S is placed on the tray main body 50. A pair of hooks 51 are arranged on the manual feed tray 5. The hooks 51 project toward the housing 200 from opposite end parts of the manual feed tray 5 in the axial direction. A projection 51B (FIG. 11) projecting outwardly in the axial direction is provided on a tip part of the hook 51. Note that the structure of the hook 51 is described in detail later.

The link members 52 (FIG. 4) are members arranged between the manual feed tray 5 and the front frame 250H to be described later and linking the housing 200 and a divided unillustrated downstream tray (movable tray) of the manual feed tray 5. The link members 52 restrict an opening angle of the manual feed tray 5. A pair of the bearing portions 53 are arranged on a lower end part of the tray main body 50 of the manual feed tray 5. Specifically, as shown in FIG. 5, the bearing portions 53 are arranged on a lower part of a substantially U-shaped rib 501 arranged along the peripheral edge of the tray main body 50. The bearing portions 53 are bearing portions to be externally fitted to the supporting shaft portion 6 to be described later and form a pivot portion for a rotational movement of the manual feed tray 5.

With reference to FIGS. 3 and 4, the housing 200 includes the front frame 250H forming a part of the front wall 250. The front frame 250H is a resin frame standing on a front part of the housing 200. In the closed state of the manual feed tray 5 with respect to the housing 200, the manual feed tray 5 is attached to the front frame 250H.

Figure 6:
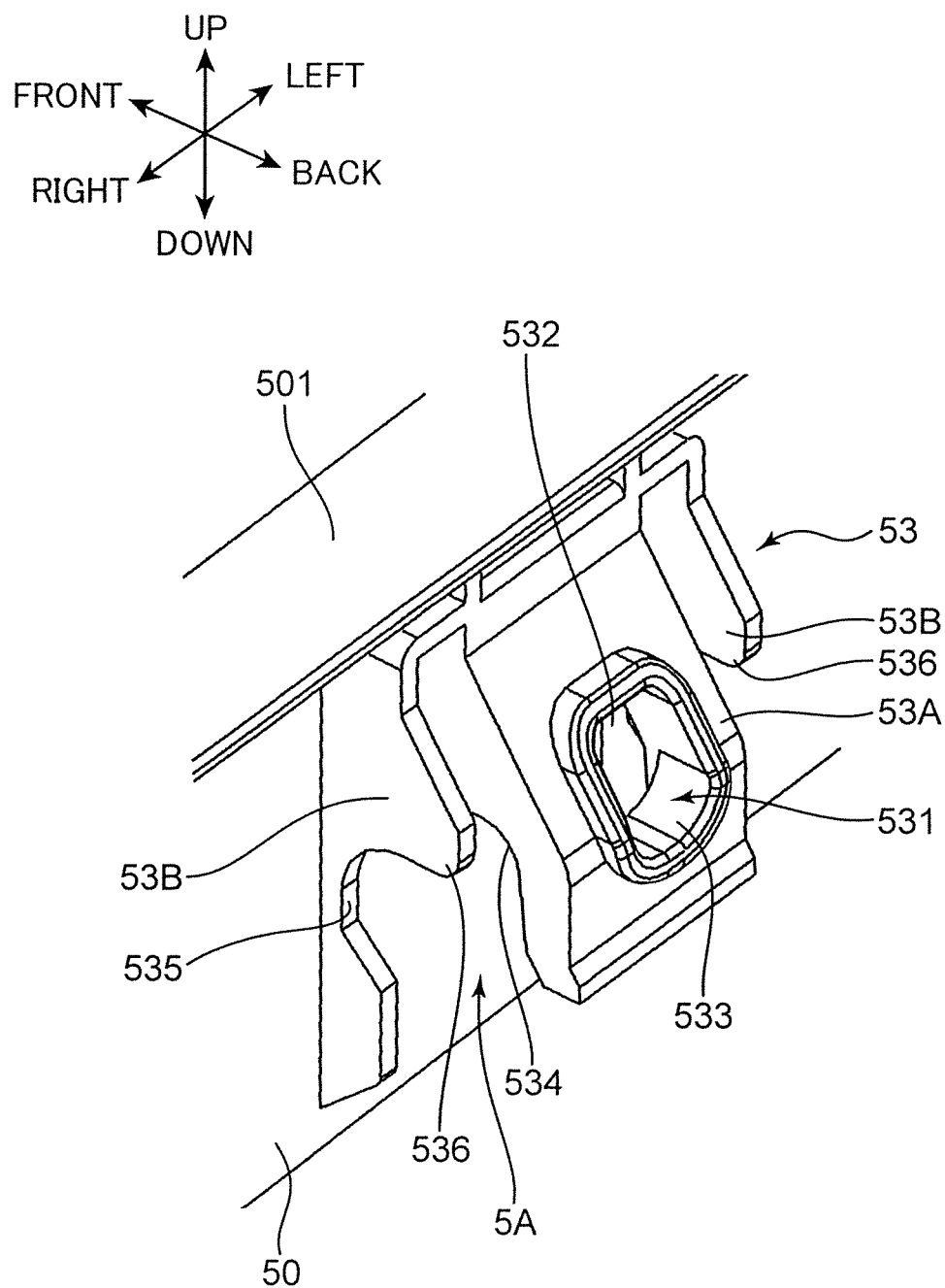
FIG. 6 is an enlarged perspective view enlargedly showing a part of the manual feed tray according to the one embodiment of the present disclosure.
Figure 7:
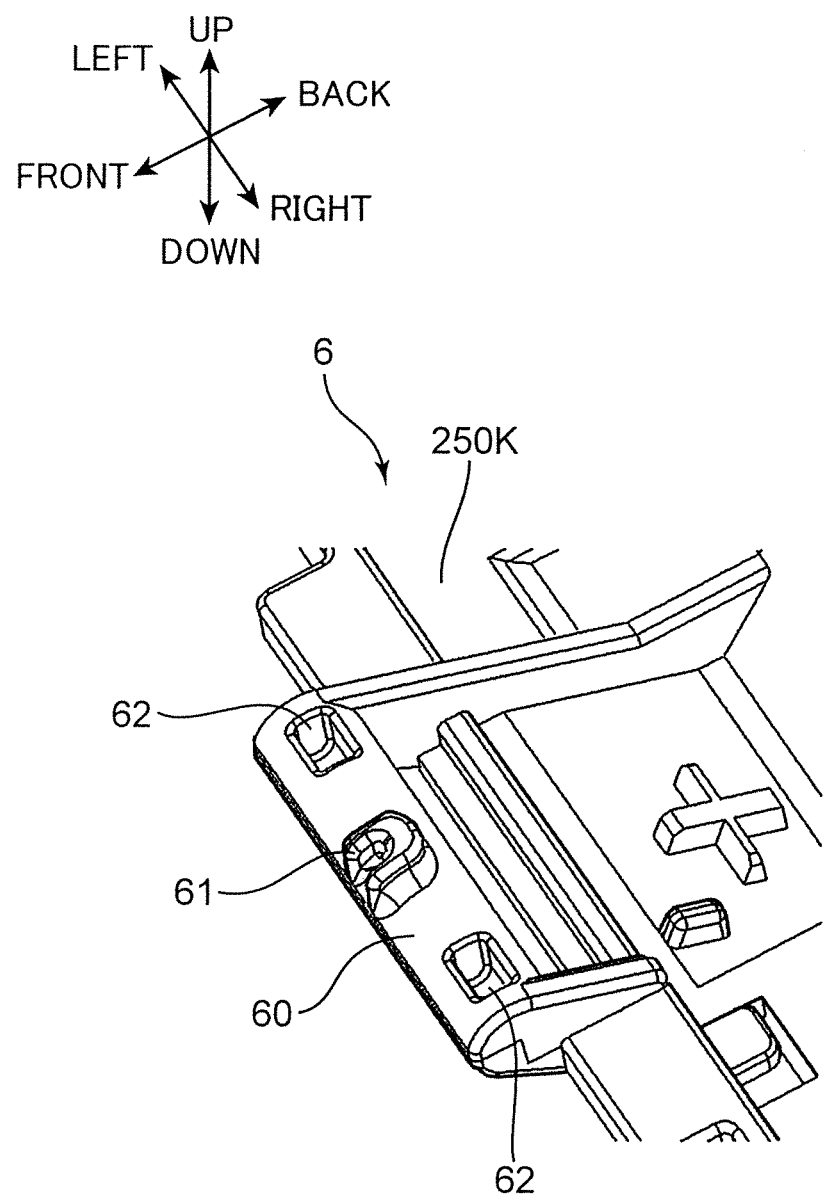
FIG. 7 is an enlarged perspective view enlargedly showing a part of an apparatus main body of the image forming apparatus according to the one embodiment of the present disclosure.
Figure 8:
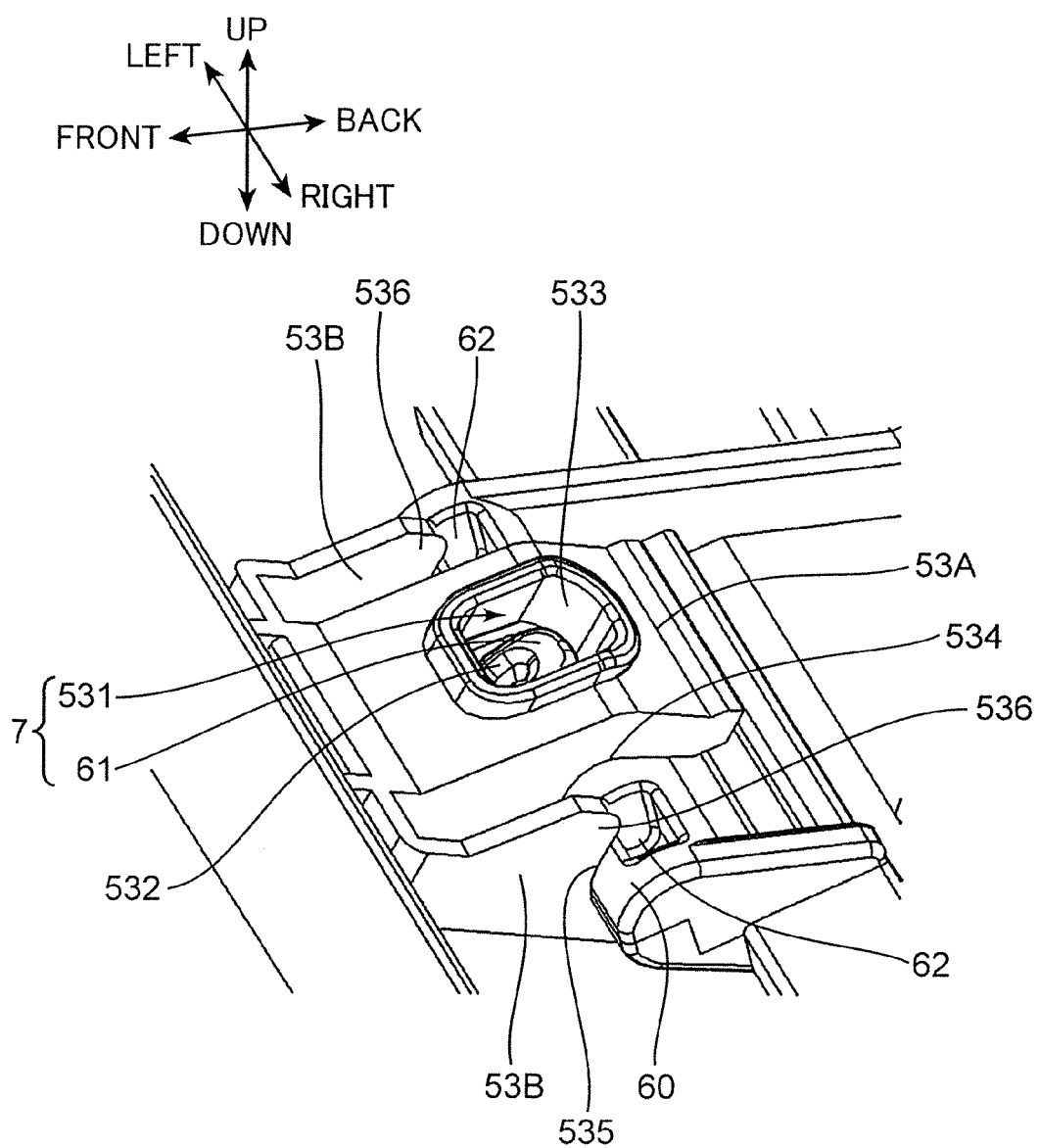
FIG. 8 is an enlarged perspective view showing a coupled state of the manual feed tray and the apparatus main body according to the one embodiment of the present disclosure.
Figure 9:
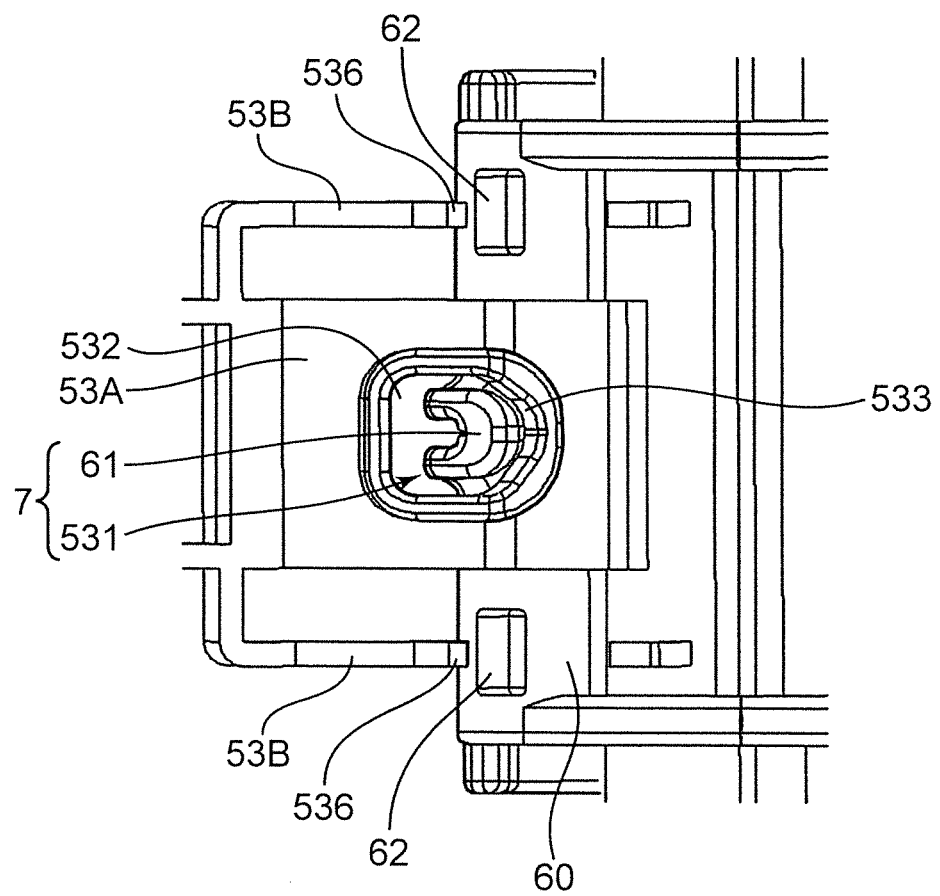
FIG. 9 is a plan view showing the coupled state of the manual feed tray and the apparatus main body of FIG. 8.

Next, the structure for coupling the manual feed tray 5 and the housing 200 is further described in detail with reference to FIGS. 6 to 9. FIG. 6 is an enlarged perspective view enlargedly showing a part of the manual feed tray 5. FIG. 7 is an enlarged perspective view enlargedly showing a part of a lower frame 250K of FIG. 5. FIG. 8 is an enlarged perspective view showing a coupled state of the manual feed tray 5 and the lower frame 250K of the housing 200. FIG. 9 is a plan view showing the coupled state of FIG. 8.

With reference to FIG. 6, each of the pair of bearing portions 53 includes a first member 53A and second members 53B.

The first member 53A is arranged in a central part of the bearing portion 53 in the lateral direction. In the closed state of the manual feed tray 5 where the manual feed tray 5 vertically extends (FIG. 3), the first member 53A is a projecting piece projecting backward and downward from the lower part of the rib 501. An engaging hole 531 is open on the first member 53A. The engaging hole 531 is a long hole open on the first member 53A along a circumferential direction of the rotation of the manual feed tray 5. An engaging projection 61 is inserted into the engaging hole 531. The engaging hole 531 includes a first supporting portion 532 and a second supporting portion 533. The first supporting portion 532 corresponds to one circumferential end side of the engaging hole 531 and the second supporting portion 533 corresponds to the other circumferential end side of the engaging hole 531. Further, the first member 53A includes a first shaft supporting portion 534. The first shaft supporting portion 534 is a peripheral surface formed in an area of the first member 53A facing the tray main body 50. The first shaft supporting portion 534 of the first member 53A supports a circumferential part of a shaft portion 60 to be described later.

A pair of second members 53B are arranged at opposite sides of the first member 53A in the lateral direction (axial direction of the shaft portion 60 to be described later). The second member 53B is a projecting piece projecting from the tray main body 50. In the perspective view shown in FIG. 6, a substantially triangular upper end part of the second member 53B projects backward. An entering projection 536 is arranged on the tip of the upper end part. The entering projection 536 is inserted into a hole portion 62 to be described later. On the other hand, a trapezoidal lower end part of the second member 53B projects with a height lower than the upper end part. A vertical central part of the second member 53B is cut arcuately toward the tray main body 50, thereby forming a second shaft supporting portion 535. The second shaft supporting portion 535 of the second member 53B comes into contact with a circumferential part of the shaft portion 60 to be described later, thereby supporting the shaft portion 60 together with the first shaft supporting portion 534 of the first member 53A.

Further, the front frame 250H includes the lower frame 250K (FIG. 5). The lower frame 250K is a frame arranged on a lower side out of the front frame 250H. As shown in FIG. 5, the lower frame 250K is a plate-like member extending in the lateral direction while having a predetermined width in the front-back direction. The lower frame 250K is arranged to be connected to the tray main body 50 of the manual feed tray 5 in the open state. A sheet S placed on the manual feed tray 5 is carried into the housing 200 along an upper surface part of the lower frame 250K. Note that, although not shown in FIG. 5, a lift plate 250L is arranged on the upper surface part of the lower frame 250K as shown in FIG. 4. The lift plate 250L is rotatable to push up the leading end side of the sheet S placed on the manual feed tray 5. At this time, an elevating plate pivot portion 251 (FIG. 5) serves as a pivot of the rotation of the lift plate 250L.

The lower frame 250K includes supporting shaft portions 6 (FIG. 7). A pair of the supporting shaft portions 6 are arranged on the front end edge of the lower frame 250K. The supporting shaft portion 6 projects forward from this end edge. With reference to FIG. 7, the supporting shaft portion 6 includes the shaft portion 60, the engaging projection 61 and the hole portion 62. The shaft portion 60 is arranged on a front end part of the supporting shaft portion 6. A front part of the shaft portion 60 has an arcuate shape. The shaft portion 60 extends in a direction of an axis of the rotation of the manual feed tray 5 (lateral direction) and serves as a rotary shaft in the rotation of the manual feed tray 5. The shaft portion 60 is mounted into the bearing portion 53 of the manual feed tray 5. The engaging projection 61 projects upwardly from a lateral central part of the shaft portion 60. The engaging projection 61 is a substantially U-shaped projection.

Note that the engaging projection 61 of the supporting shaft portion 6 and the engaging hole 531 of the bearing portion 53 of the manual feed tray 5 function as a restricting portion 7 (FIG. 8). The restricting portion 7 restricts the position of the manual feed tray 5 in the axial direction in the open state of the manual feed tray 5 with respect to the housing 200.

Next, a rotational movement of the manual feed tray 5 about the bearing portions 53 and the supporting shaft portions 6 is described. When the bearing portion 53 shown in FIG. 6 is viewed in a cross-section (not shown) intersecting with the lateral direction, a space between the first member 53A and the second members 53B is partly open in the circumferential direction (open area 5A, see FIG. 6). In FIG. 6, lower part between the first member 53A and the second members 53B is open. When the manual feed tray 5 is attached to the lower frame 250K of the housing 200, the bearing portions 53 are attached to the shaft portions 60 of the supporting shaft portions 6 via the open area 5A. As a result, as shown in FIG. 8, the shaft portion 60 of the supporting shaft portion 6 is fitted between the first shaft supporting portion 534 of the first member 53A and the second shaft supporting portions 535 of the pair of second members 53B. The manual feed tray 5 is rotatable about the shaft portions 60 with respect to the housing 200. At this time, the engaging projections 61 projecting from the shaft portions 60 are inserted into the engaging holes 531 open on the first members 53A.

In this embodiment, an opening width of the first supporting portion 532 of the engaging hole 531 in the axial direction (lateral direction) is set wider than the width of the engaging projection 61 in the axial direction. On the other hand, an opening width of the second supporting portion 533 of the engaging hole 531 in the axial direction is set substantially equal to the width of the engaging projection 61 in the axial direction. In other words, in a top view shown in FIG. 9, a part of the engaging hole 531 on the side of the second supporting portion 533 is tapered to have a narrower opening width toward the back. At this time, since the second supporting portion 533 is inclined toward the center, the engaging projection 61 can be positioned in the center of the engaging hole 531.

As the manual feed tray 5 is opened and closed with respect to the housing 200, the engaging holes 531 of the first members 53A move in the circumferential direction with respect to the engaging projections 61. In the closed state of the manual feed tray 5 shown in FIG. 3, the engaging projections 61 are arranged on the side of the first supporting portions 532 of the engaging holes 531. At this time, predetermined clearances are formed in the axial direction between inner wall parts of the first members 53A defining the first supporting portions 532 and the engaging projections 61. Thus, in the closed state of the manual feed tray 5, the manual feed tray 5 is slidable by a predetermined distance in the lateral direction with respect to the housing 200.

On the other hand, when the manual feed tray 5 is opened and set in the open state shown in FIG. 5, the engaging projections 61 are fitted into the second supporting portions 533 of the engaging holes 531 as shown in FIG. 9. Note that the engaging projections 61 are guided to the inclined surfaces of the second supporting portions 533 while moving toward the second supporting portions 533 when the manual feed tray 5 is opened. As a result, the engaging projections 61 are positioned at center positions of the engaging holes 531 as described above. As a result, the position of the manual feed tray 5 in the axial direction (lateral direction) is restricted. In the open state of the manual feed tray 5, the lateral position of a sheet S placed on the tray main body 50 of the manual feed tray 5 needs to be restricted. This is because, if the position of the sheet S varies, the posture of the sheet S carried into the housing 200 varies to cause a sheet jam or the like. In this embodiment, troubles such as the sheet jam are prevented since the position of the manual feed tray 5 is stably maintained as described above in a state where the sheet S is placed. Further, an image position deviation caused by a feeding position deviation of the sheet S can be prevented.

Figure 11:
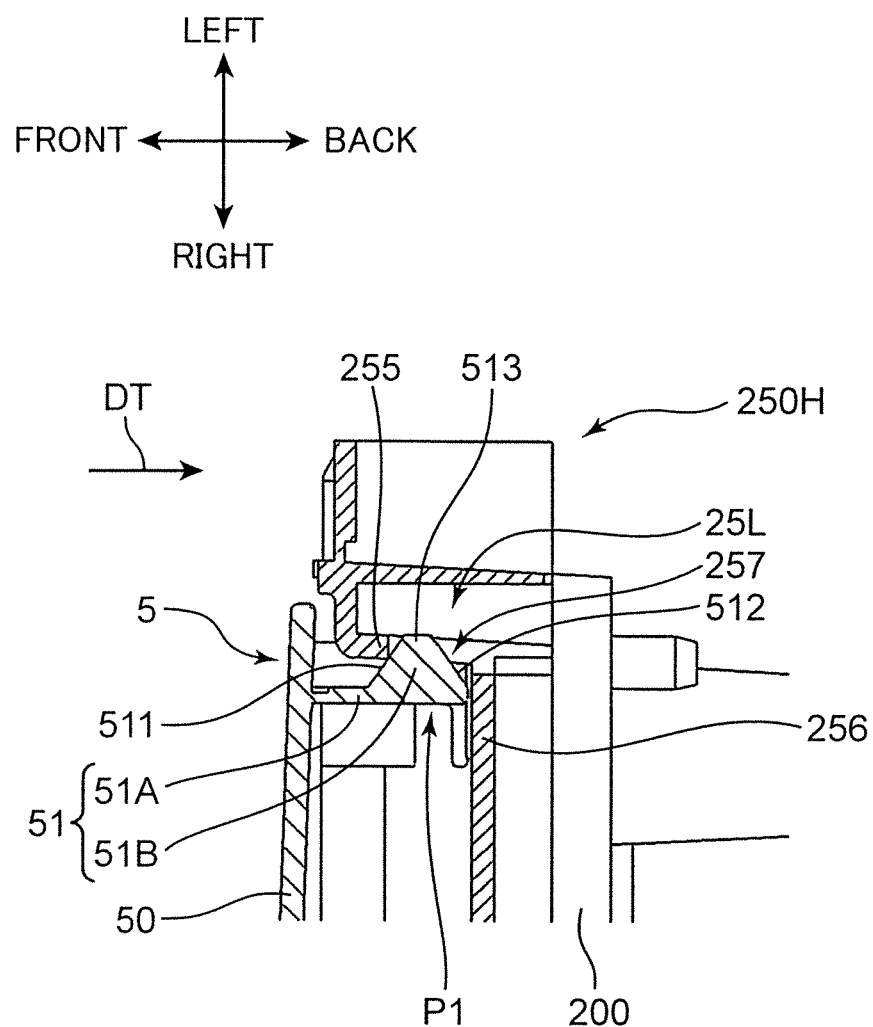
FIG. 11 is an enlarged sectional view enlargedly showing a part of FIG. 10B.
Figure 12:
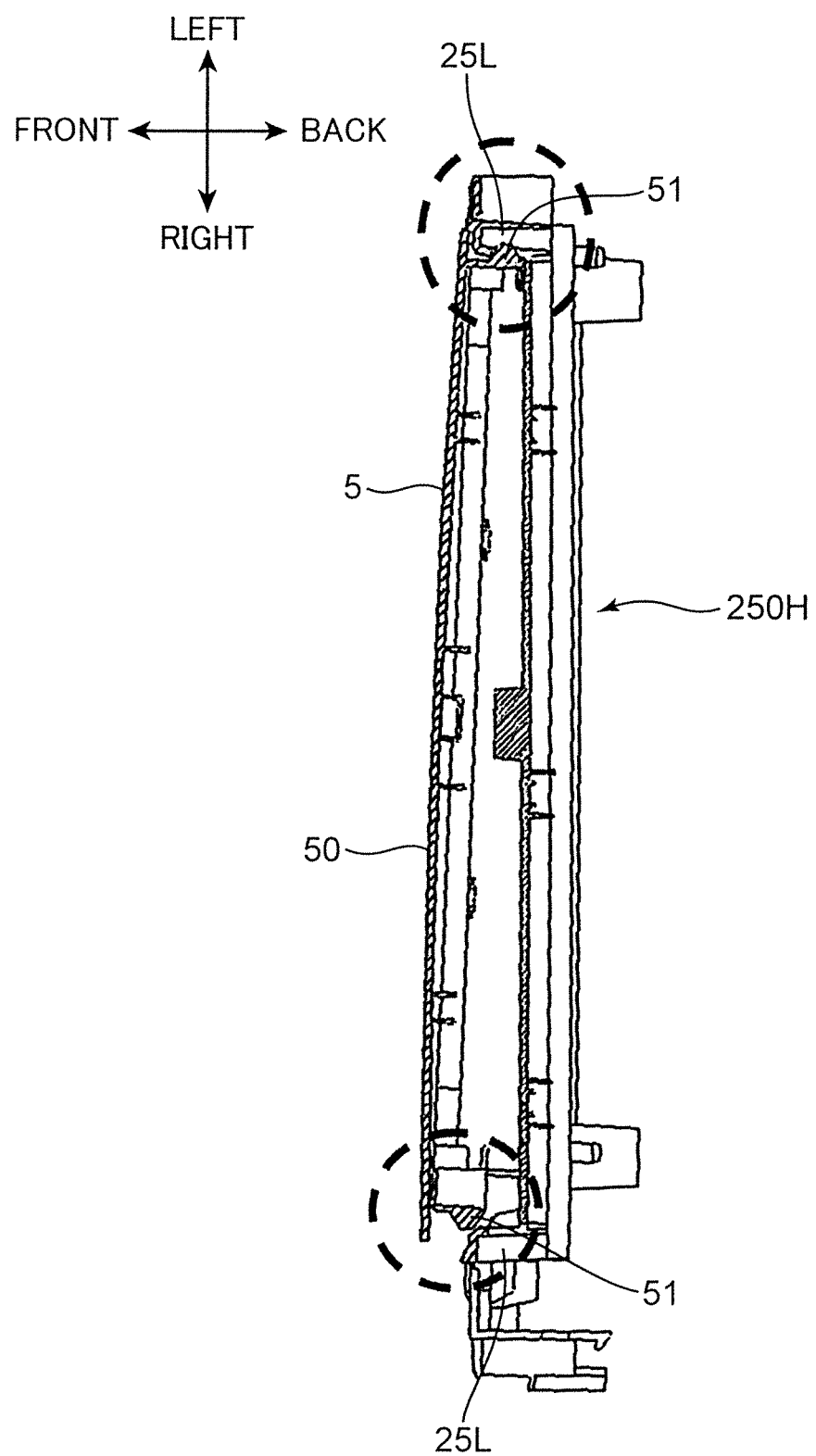
FIG. 12 is a sectional view showing a state where the manual feed tray according to the one embodiment of the present disclosure is in a one-sided closed state with respect to the apparatus main body.
Figure 13:
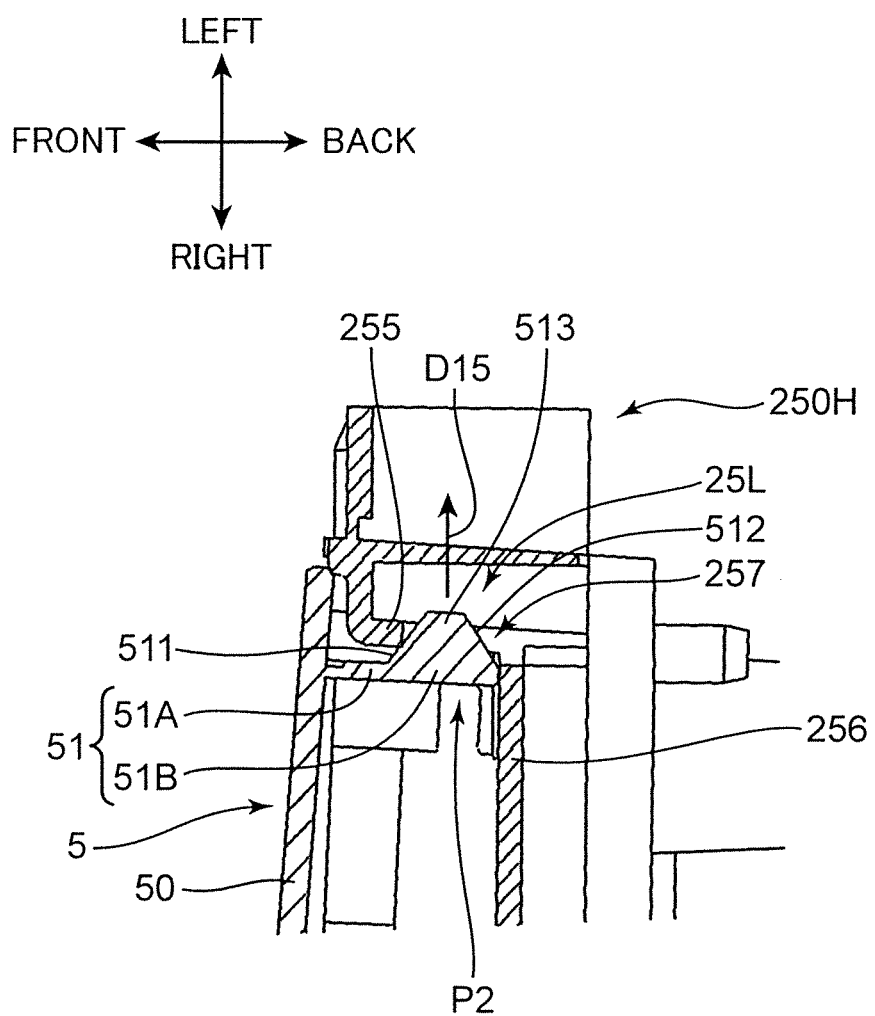
FIG. 13 is an enlarged sectional view enlargedly showing a part of FIG. 12.
Figure 14:
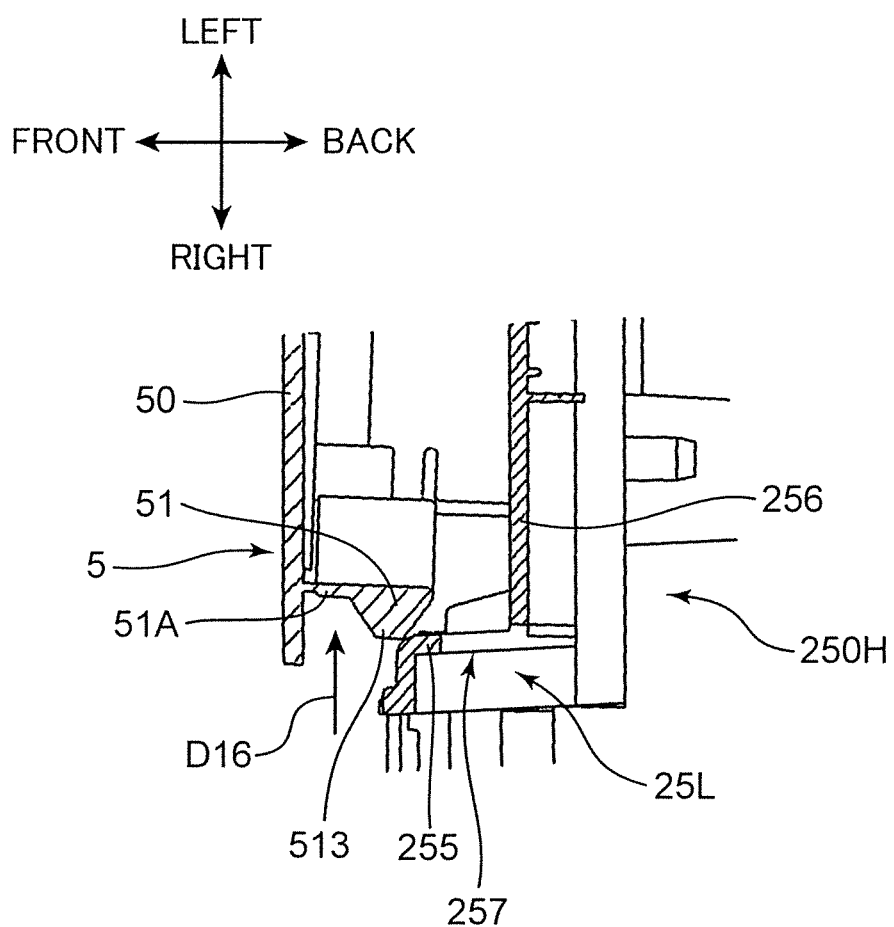
FIG. 14 is an enlarged sectional view enlargedly showing a part of FIG. 12.

Next, a structure for fixing the manual feed tray 5 to the housing 200 is described in detail with reference to FIGS. 10A to 14. FIG. 10A is a side view showing a state where the manual feed tray 5 according to this embodiment is properly fixed to the housing 200, and FIG. 10B is a sectional view along a line A-A of FIG. 10A showing the state where the manual feed tray 5 according to this embodiment is properly fixed to the housing 200. Further, FIG. 11 is an enlarged sectional view enlargedly showing a part (area enclosed by broken line) of FIG. 10B. FIG. 12 is a sectional view showing a state where the manual feed tray 5 according to this embodiment is fixed in a one-sided closed state to the housing 200. FIGS. 13 and 14 are enlarged sectional views enlargedly showing parts (areas enclosed by broken line) of FIG. 12.

With reference to FIG. 11, the hook 51 includes a base end portion 51A and the projection 51B. The base end portion 51A is a base end part of the hook 51 and projects from the tray main body 50 of the manual feed tray 5 toward the front frame 250H. The projection 51B is arranged on a tip side of the base end portion 51A and projects laterally outwardly of the manual feed tray 5. As shown in FIG. 11, in a cross-section along the axial direction of the shaft portion 60 (FIG. 8) (cross-section including the front-back direction and the lateral direction), the projection 51B has a substantially triangular shape. The projection 51B has a first slant 511, a second slant 512 and a top portion 513. The first slant 511 is an inclined surface inclined axially outwardly (toward an opening 257 to be described later, from the base end portion 51A toward the top portion 513 to be described later) along an closing direction of the manual feed tray 5 toward the housing 200 (direction of an arrow DT of FIG. 11). The first slant 511 is arranged on a rear end side in the closing direction. The first slant 511 is connected to the base end portion 51A. Further, the second slant 512 is an inclined surface arranged on a lead end side in the closing direction and inclined axially inwardly (away from the opening 257 to be described later, from the top portion 513 to be described later toward the base end portion 51A) along the closing direction. The top portion 513 is arranged between the first and second slants 511, 512, corresponds to a top part of the projection 51B and projects from the base end portion 51A toward the opening 257 to be described later. The top portion 513 is a flat surface portion extending along the front-back direction.

On the other hand, the front frame 250H includes fixing portions 25L (FIG. 11). A pair of the fixing portions 25L are arranged to correspond to the pair of hooks 51 of the manual feed tray 5. The hooks 51 are respectively fixed to the pair of fixing portions 25L. The fixing portion 25L includes the opening 257 and a contact portion 255 (engaging portion). Further, the front frame 250H includes a facing plate 256. The facing plate 256 is a standing wall portion of the front frame 250H facing the tray main body 50.

The openings 257 are openings formed on a pair of inner wall parts arranged on the left and right of the front frame 250H. When the manual feed tray 5 is closed with respect to the housing 200, the projections 51B of the aforementioned hooks 51 are inserted axially outward (leftward in FIG. 11) into the openings 257. The contact portion 255 defines a part of the opening 257 and the projection 51B is engageable therewith. In this embodiment, the contact portion 255 defines a front side of the opening 257 and can come into contact with the first slant 511 of the projection 51B. The contact portion 255 is a wall surface which is a part of the front frame 250H and extends in the front-back direction on the front side of the opening 257. Note that although the periphery of the left hook 51 of the manual feed tray 5 is shown in FIG. 11, the vicinity of the right hook 51 of the manual feed tray 5 also has a similar structure.

As described above, in this embodiment, the manual feed tray 5 is capable of making a slight sliding movement in the lateral direction in the closed state of the manual feed tray 5 with respect to the housing 200. The manual feed tray 5 is characterized in that the engaged positions of the projections 51B with the contact portions 255 are variable in the axial direction (lateral direction) according to the sliding movement.

As shown in FIGS. 10A and 10B, the projections 51B are engaged with the contact portions 255 at a first position P1 (FIG. 11) in the closed state of the manual feed tray 5 where the pair of projections 51B are respectively engaged with the pair of contact portions 255. Note that, according to a closing movement of the manual feed tray 5, the top portions 513 come into contact with the contact portions 255 and are guided to the openings 257 while the projections 51B are curved rightward. At the first position P1, the top portion 513 between the first and second slants 511, 512 is inserted into the opening 257 and the contact portion 255 comes into contact with the first slant 511, whereby the projection 51B is fixed to the fixing portion 25L. The contact portion 255 is in contact with a substantially central part of the first slant 511. Further, the hook 51 is similarly fixed to the fixing portion 25L on an opposite side of the manual feed tray 5 not shown in FIG. 11.

On the other hand, the manual feed tray 5 may be closed in a one-sided closed state where the projection 51B of one of the pair of hooks 51 (projection 51B of the left hook 51 in FIG. 12) is engaged with the contact portion 255 and the other projection 51B (projection 51B of the right hook 51 in FIG. 12) is not engaged. Particularly, the use frequency of the manual feed tray 5 is relatively lower than that of the cassette 110 (FIGS. 1 and 2) in the case of the manual feed tray 5 on which the hooks 51 are arranged as in this embodiment. Thus, the manual feed tray 5 may be left for a long time in the one-sided closed state. In this case, if a biased load is applied to the manual feed tray 5 for a long time, the base end portion 51A of the hook 51 may be plastically deformed, thereby hindering proper fixing of the manual feed tray 5 thereafter.

In this embodiment, to solve the above problem, a load acting on the hook 51 is reduced even if the manual feed tray 5 is in the one-sided closed state. Specifically, in this embodiment, the projection 51B of the left hook 51 is engaged with the contact portion 255 at a second position P2 (FIG. 13) in the one-sided closed state shown in FIG. 12. At the second position P2, the top portion 513 is further inserted into the opening 257 than at the first position P1. Specifically, when the left hook 51 is attached to the fixing portion 25L by a user, the projection 51B is fixed in a state further inserted into the opening 257 than at the first position P1 that is an original fixed position. At this second position P2, the top portion 513 is inserted deeper into the opening 257 than at the first position P1 and the contact portion 255 is in contact with a side of the first slant 511 closer to the base end portion 51A than at the first position P1, whereby the hook 51 is fixed to the fixing portion 25L.

The manual feed tray 5 is made slidable in the lateral direction as described above to enable the manual feed tray 5 to be fixed in a state where the projection 51B is moved more laterally outward than at the original fixed position (first position P1). Specifically, in the one-sided closed state shown in FIG. 12, the manual feed tray 5 is slightly moved to the left as compared with the proper closed state shown in FIGS. 10A and 10B. Thus, with reference to FIG. 14, the right hook 51 is stationary at a position to the left (arrow D16 of FIG. 14) of the position thereof when the manual feed tray 5 cannot slide. Thus, even if the manual feed tray 5 is left in the one-sided closed state for a long time, the top portion 513 of the right hook 51 (FIG. 14) is not strongly pressed by the contact portion 255 and the plastic deformation of the base end portion 51A of the hook 51 is prevented.

As described above, according to this embodiment, the manual feed tray 5 is slidable in the axial direction in the closed state of the manual feed tray 5. The engaged positions of the projections 51B with the contact portions 255 in the axial direction are changeable according to the sliding movement. As a result, the action of an excessive load on the hooks 51 is prevented by the sliding movement of the manual feed tray 5 also when the hooks 51 are fixed to the fixing portions 25L in an inclined state or in the one-sided closed state where one hook 51 is not fixed to the fixing portion 25L. Thus, the plastic deformation of the hooks 51 is prevented. Particularly, in the one-sided closed state of the manual feed tray 5, the projection 51B of one hook 51 is engaged with the contact portion 255 while being inserted more into the opening 257 than in normal time. Thus, the other hook 51 is moved away from the fixing portion 25L in the axial direction. Thus, the action of an excessive load on the other hook 51 is suppressed.

Further, a resin material can be used for the hooks 51 since the plastic deformation of the hooks 51 of the manual feed tray 5 is prevented in this way. In other words, it is not necessary to use a metal material for main parts of the hooks 51 and the cost of the hooks 51 is reduced. Further, the tray main body 50 and the hooks 51 can be integrally molded by resin molding and the manufacturing cost of the manual feed tray 5 can be reduced.

Furthermore, in this embodiment, the position of the manual feed tray 5 in the axial direction is restricted in the open state of the manual feed tray 5 where a sheet S is placed on the upper surface of the manual feed tray 5. Thus, the position of the placed sheet S is stably maintained. As a result, the sheet S is stably carried into the housing 200 to prevent a variation of the position of an image formed on the sheet S. Further, it is suppressed that the sheet S is carried into in an inclined state, thereby preventing a sheet jam. Furthermore, the manual feed tray 5 is stably rotated by the supporting shaft portions 6 and the bearing portions 53. Further, the sliding movement of the manual feed tray 5 in the closed state and restriction on the axial position of the manual feed tray 5 in the open state are realized by the engaging projections 61 of the supporting shaft portions 6 and the engaging holes 531 of the bearing portions 53.

Although the printer 100 (image forming apparatus) according to the embodiment of the present disclosure is described above, the present disclosure is not limited to this. For example, the following modifications may be adopted.

(1) Although the hook 51 of the manual feed tray 5 has two inclined surfaces, i.e. the first and second slants 511, 512 in the above embodiment, the present disclosure is not limited to this. The hook 51 may have one inclined surface, e.g. the first slant 511 or may have another curved surface.

(2) Although the engaging holes 531 are arranged on the manual feed tray 5 and the engaging projections 61 are arranged on the housing 200 in the above embodiment, the present disclosure is not limited to this. The engaging projections 61 may be arranged on the manual feed tray 5 and the engaging holes 531 may be arranged on the housing 200. Further, the manual feed tray 5 is not limited to such a mode as to be attached to the supporting shaft portions 6 of the housing 200 via the spaces between the first members 53A and the second members 53B. After the second members 53B are fitted to the shaft portions 60 of the supporting shaft portions 6, the first members 53A may be fastened to the manual feed tray 5 such as by screws.

Although the present disclosure has been fully described by way of example with reference to the accompanying drawings, it is to be understood that various changes and modifications will be apparent to those skilled in the art. Therefore, unless otherwise such changes and modifications depart from the scope of the present disclosure hereinafter defined, they should be construed as being included therein.

The invention claimed is:

1. An image forming apparatus, comprising:
an apparatus main body;
an image forming unit arranged in the apparatus main body and configured to forms an image on a sheet;
a tray unit that includes a pivot portion on a lower end part and is openable with respect to the apparatus main body by being rotated about the pivot portion, the tray unit having an upper surface on which the sheet is placed in an open state of the tray unit with respect to the apparatus main body and that is capable of making a sliding movement in an axial direction of the pivot portion in a closed state with respect to the apparatus main body,
the tray unit including first and second hooks projecting toward the apparatus main body respectively from opposite first and second end parts in the axial direction, each of the hooks having a base end portion projecting in a closing direction in which the tray unit is closed with respect to the apparatus main body and a projection projecting toward an axially outer side on a tip part of the base end portion in a direction parallel to the axial direction; and
an attaching portion arranged on the apparatus main body and to which the tray unit is attached in the closed state, the attaching portion including:
a facing plate standing to face the tray unit;
first and second fixing portions projecting from respective first and second axial ends of the facing plate in an opening direction in which the tray unit is opened, the fixing portions being opposed to each other in the axial direction;
first and second openings disposed respectively on the first and second fixing portions, the first and second projections being inserted respectively into the first and second openings toward the axially outer sides; and
first and second engaging portions that define parts of the respective first and second openings and with which the respective first and second projections are engaged, and
engaged positions of the first and second projections with the respective first and second engaging portions in the axial direction are variable according to the sliding movement in the axial direction in the closed state of the tray unit.

2. An image forming apparatus according to claim 1, wherein:
the first and second projections are engaged respectively with the first and second engaging portions at a first position in the closed state of the tray unit where the projections of the respective hooks are engaged respectively with the engaging portions, and
the first projection is engaged with the first engaging portion at a second position where the first projection is inserted more into the first opening than at the first position in a one-sided closed state of the tray unit where the first projection is engaged with the first engaging portion and the second projection is not engaged with the second engaging portion.

3. An image forming apparatus according to claim 2, wherein:
each of the first and second projections includes:
a top portion projecting from the base end portion toward the opening;
a first slant arranged on a rear end side in an closing direction of the tray unit toward the apparatus main body and inclined from the respective base end portion toward the respective top portion; and
a second slant arranged on a lead end side in the closing direction and inclined from the top portion toward the base end portion,
each of the first and second engaging portions defines a rear end side of the opening in the closing direction and is capable of coming into contact with the first slant of the respective projection,
the top portions of the first and second projections are inserted respectively into the first and second openings and the first and second engaging portion comes into contact with the respective first slants at the first position, whereby the projections are engaged respectively with the engaging portions, and
at the second position, the top portion of the first projection is inserted more into the first opening than at the first position and the first engaging portion comes into contact with a side of the first slant of the first projection closer to the base end portion than at the first position so that the first projection is engaged with the engaging portion.

4. An image forming apparatus according to claim 1, further comprising:
a restricting portion for restricting the position of the tray unit in the axial direction in the open state with respect to the apparatus main body.

5. An image forming apparatus according to claim 4, wherein:
the attaching portion includes a shaft portion extending along the axial direction and serving as a rotary shaft in the rotation of the tray unit,
the pivot portion is a bearing portion to be externally fitted on the shaft portion,
the restricting portion includes:
an engaging projection projecting from the shaft portion; and
an engaging hole in the form of an elongated hole open on the bearing portion along a circumferential direction of the rotation of the tray unit and into which the engaging projection is inserted,
an opening width of one circumferential end side of the engaging hole in the axial direction is set wider than the width of the engaging projection in the axial direction and an opening width of the other circumferential end side of the engaging hole in the axial direction is set substantially equal to the width of the engaging projection in the axial direction,
the engaging hole is movable in the circumferential direction with respect to the engaging projection as the tray unit is opened and closed with respect to the apparatus main body, and
the tray unit is made slidable in the closed state by forming a clearance in the axial direction between the one end side of the engaging hole and the engaging projection and the position of the tray unit in the axial direction is restricted in the open state by fitting the engaging portion into the other end side of the engaging hole.

6. An image forming apparatus according to claim 5, wherein:
the bearing portion includes:

a first member on which the engaging hole is open and which supports a circumferential part of the shaft portion; and a pair of second members which are arranged at opposite sides of the first member in the axial direction and support circumferential parts of the shaft portion, and an open area between the first and second members is partly open along the circumferential direction in a cross-section intersecting with the axial direction and the shaft portion is attached between the first member and the second members via the open area, whereby the shaft portion is rotatably supported on the first and second members.

\* \* \* \* \*